US010964282B2

(12) United States Patent  
Kanda

(10) Patent No.: US 10,964,282 B2
(45) Date of Patent: Mar. 30, 2021

(54) POWER SUPPLY CIRCUIT AND DISPLAY DEVICE

(71) Applicant: Sharp Kabushiki Kaisha, Osaka (JP)

(72) Inventor: Keisuke Kanda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 90 days.

(21) Appl. No.: 15/929,136

(22) Filed: Jun. 5, 2019

(65) Prior Publication Data

US 2019/0378470 A1 Dec. 12, 2019

Related U.S. Application Data

(60) Provisional application No. 62/683,690, filed on Jun. 12, 2018.

(51) Int. Cl.
| | |
|---|---|
| *G09G 3/36* | (2006.01) |
| *H01L 27/12* | (2006.01) |
| *G02F 1/133* | (2006.01) |
| *G02F 1/1368* | (2006.01) |
| *H03K 19/20* | (2006.01) |

(52) U.S. Cl.
CPC ......... *G09G 3/3677* (2013.01); *G09G 3/3696* (2013.01); *G02F 1/1368* (2013.01); *G02F 1/13306* (2013.01); *G02F 2202/10* (2013.01); *G09G 2310/0243* (2013.01);
(Continued)

(58) Field of Classification Search
CPC ............... G02F 1/13306; G02F 1/1368; G02F 2202/10; G09G 2310/0243; G09G 2310/063; G09G 2320/0257; G09G 2330/027; G09G 3/3677; G09G 3/3696; H01L 27/0251; H01L 27/1225; H03K 19/20
See application file for complete search history.

(56) References Cited

U.S. PATENT DOCUMENTS

2003/0184538 A1 10/2003 Yamato et al.
2008/0316195 A1* 12/2008 Li .................... G09G 3/3677
345/212

(Continued)

FOREIGN PATENT DOCUMENTS

| CN | 101471054 A | 7/2009 |
|---|---|---|
| JP | 2013-97071 A | 5/2013 |

*Primary Examiner* — Kenneth Bukowski
(74) *Attorney, Agent, or Firm* — Keating & Bennett, LLP

(57) ABSTRACT

A power supply circuit includes a voltage boosting circuit for boosting a supplied first power supply voltage to a second power supply voltage used in a drive circuit of a display device, a capacitor provided between a power supply wiring for outputting the second power supply voltage and a ground, a logic circuit for outputting a high-level signal when the first power supply voltage and a supplied first control signal are at a high level, a delay circuit for outputting a signal obtained by delaying an output signal of the logic circuit as a second control signal used for an operation control of the drive circuit, and a resistor provided between an input terminal of the delay circuit and the ground. The power supply circuit may include a first diode on the power supply wiring, or may include a second diode having an anode terminal connected to an output terminal of the second control signal and a cathode terminal connected to the input terminal of the delay circuit.

15 Claims, 7 Drawing Sheets

(52) U.S. Cl.
CPC .. *G09G 2320/0257* (2013.01); *H01L 27/1225* (2013.01); *H03K 19/20* (2013.01)

(56) References Cited

U.S. PATENT DOCUMENTS

| | | | |
|---|---|---|---|
| 2009/0167746 A1 | 7/2009 | Yoon | |
| 2009/0302903 A1* | 12/2009 | Woo | G09G 3/3696 327/143 |
| 2010/0156872 A1* | 6/2010 | Pankaj | G09G 3/3696 345/211 |

* cited by examiner

POWER SUPPLY CIRCUIT AND DISPLAY DEVICE

CROSS-REFERENCE TO RELATED APPLICATION

This application claims the benefit of U.S. Provisional Patent Application No. 62/683,690 filed on Jun. 12, 2018, and entitled "Power Supply Circuit And Display Device", which is incorporated herein by reference in its entirety.

BACKGROUND OF THE INVENTION

Field of the Invention

The present invention relates to a display device, and particularly relates to a power supply circuit of the display device.

Description of Related Art

In recent years, a technology for forming thin film transistors included in a liquid crystal panel or the like using an oxide semiconductor, such as IGZO (Indium Gallium Zinc Oxide), is put into practical use. A liquid crystal panel using IGZO (hereinafter referred to as an IGZO liquid crystal panel) has a high charge holding capability. Therefore, according to a liquid crystal display device having the IGZO liquid crystal panel, an update of a screen can be reduced when a same screen is displayed continuously, and power consumption can be reduced.

In the liquid crystal display device having the IGZO liquid crystal panel, it is necessary to draw out charge held in the liquid crystal panel when a power supply turns off. More specifically, it is necessary to draw out charge stored in pixels or a scanning line drive circuit after stopping drive of the liquid crystal panel. Hereinafter, this operation is referred to as "discharge". When the discharge is performed, a high voltage (for example, +21 V to −7 V) used for driving scanning lines is used.

As for a power supply circuit of the liquid crystal display device, various kinds of circuits are conventionally known. For example, Japanese Laid-Open Patent Publication No. 2013-97071 discloses a power supply circuit shown in FIG. 10. A power supply circuit 90 shown in FIG. 10 includes an analog power supply 91, a digital power supply 92 for outputting a voltage lower than that of the analog power supply 91, a voltage lowering circuit 93, a first switch section 94, and a second switch section 95. The second switch section 95 turns off when an input voltage or an output voltage of the digital power supply 92 becomes lower than a predetermined level. The first switch section 94 turns on when the second switch section 95 turns off.

In the liquid crystal display device having the IGZO liquid crystal panel, when the power supply turns off, the high voltage is generated using falling of a control signal as a trigger, and the discharge is performed using the high voltage. However, in an on-vehicle liquid crystal display device, the discharge may not be performed correctly, because time from falling of the control signal to falling of a power supply voltage is short.

For example, a connection to an on-vehicle battery may be lost and the power supply may be lost suddenly. In this case, since the control signal and the power supply voltage start to fall in almost same period, the power supply voltage is already low when the discharge is to be performed. Thus, the high voltage used for the discharge cannot be generated and charge cannot be fully drawn out from the pixels and the scanning line drive circuit. A similar situation occurs when the power supply voltage falls before the control signal falls, or when the power supply voltage reaches a ground level before the control signal falls. Thus, in the on-vehicle liquid crystal display device having the IGZO liquid crystal panel, a display abnormality (ghost or the like) may occur due to shortage of discharge.

SUMMARY OF THE INVENTION

Therefore, providing a power supply circuit of a display device capable of certainly performing a discharge when a power supply turns off is taken as a problem.

(1) A power supply circuit according to some embodiments of the present invention includes: a voltage boosting circuit configured to boost a supplied first power supply voltage to a second power supply voltage used in a drive circuit of a display device; a capacitor provided between a power supply wiring for outputting the second power supply voltage and a ground; a logic circuit configured to output a high-level signal when the first power supply voltage and a supplied first control signal are at a high level; a delay circuit configured to output a signal obtained by delaying an output signal of the logic circuit as a second control signal used for an operation control of the drive circuit; and a resistor provided between an input terminal of the delay circuit and the ground.

According to the above power supply circuit, when a level of the first control signal falls when a power supply turns off, a voltage of the input terminal of the delay circuit falls in a short time by an action of the resistor, and the second control signal becomes a ground level in a short time. Furthermore, since the second power supply voltage is held by an action of the capacitor for a while after the first power supply voltage falls when the power supply turns off, a discharge pulse can be generated and a discharge can be performed in the meantime. Furthermore, the second control signal rises to the high level after the second power supply voltage reaches a predetermined level. Therefore, the control signal can be generated correctly when the power supply turns on, and the discharge can be performed certainly when the power supply turns off.

(2) The power supply circuit according to some embodiments of the present invention has the configuration of above (1), and further includes a first diode on the power supply wiring.

(3) The power supply circuit according to some embodiments of the present invention has the configuration of above (1) or (2), and further includes a second diode having an anode terminal connected to an output terminal of the second control signal and a cathode terminal connected to the input terminal of the delay circuit.

(4) The power supply circuit according to some embodiments of the present invention has one of the configurations of above (1) to (3), and further includes a reset IC in a later stage of the delay circuit.

(5) The power supply circuit according to some embodiments of the present invention has one of the configurations of above (1) to (4), and the logic circuit includes a switch having one terminal to which one of the first power supply voltage and the first control signal is supplied, another terminal connected to the input terminal of the delay circuit, and a control terminal to which another of the first power supply voltage and the first control signal is supplied.

(6) The power supply circuit according to some embodiments of the present invention has the configuration of above (5), and the switch is a bipolar transistor having one conduction terminal to which one of the first power supply voltage and the first control signal is supplied, another conduction terminal connected to the input terminal of the delay circuit, and a control terminal to which another of the first power supply voltage and the first control signal is supplied.

(7) The power supply circuit according to some embodiments of the present invention has the configuration of above (5), and the switch is a MOS transistor having one conduction terminal to which one of the first power supply voltage and the first control signal is supplied, another conduction terminal connected to the input terminal of the delay circuit, and a control terminal to which another of the first power supply voltage and the first control signal is supplied.

(8) The power supply circuit according to some embodiments of the present invention has one of the configurations of above (1) to (4), and the logic circuit includes an AND circuit configured to obtain a logical product of the first power supply voltage and the first control signal to supply the logical product to the input terminal of the delay circuit.

(9) The power supply circuit according to some embodiments of the present invention has one of the configurations of above (1) to (4), and the logic circuit includes: an AND circuit configured to obtain a logical product of the first power supply voltage and the first control signal; and a switch having one terminal to which one of the first power supply voltage and the first control signal is supplied, another terminal connected to the input terminal of the delay circuit, and a control terminal to which the logical product is supplied.

(10) The power supply circuit according to some embodiments of the present invention has one of the configurations of above (1) to (4), and the delay circuit includes: a resistor provided on a signal wiring for connecting an input terminal and an output terminal; and a capacitor provided between the signal wiring and the ground.

(11) The power supply circuit according to some embodiments of the present invention has one of the configurations of above (1) to (4), and the delay circuit includes a reset IC configured to delay an input signal to output a delayed signal.

(12) A display device according to some embodiments of the present invention includes: a display panel including scanning lines and pixels; a scanning line drive circuit configured to drive the scanning lines; the power supply circuit having one of the configurations of above (1) to (11); and a signal generation circuit configured to output a discharge signal having a discharge pulse to the scanning line drive circuit based on the second power supply voltage, when the second control signal indicates an operation stop.

(13) The display device according to some embodiments of the present invention has the configuration of above (12), and the display panel is a liquid crystal panel.

(14) The display device according to some embodiments of the present invention has the configuration of above (13), and a thin film transistor included in the liquid crystal panel is formed using an oxide semiconductor.

(15) The display device according to some embodiments of the present invention has the configuration of above (14), and the oxide semiconductor is indium gallium zinc oxide.

These and other objects, features, modes and effects of the present invention will be more apparent from the following detailed description with reference to the attached drawings.

BRIEF DESCRIPTION OF THE DRAWINGS

FIG. 5 is a signal waveform diagram of the power supply circuit shown in FIG. 1 when a power supply turns on.

DETAILED DESCRIPTION OF THE INVENTION

Figure 1:
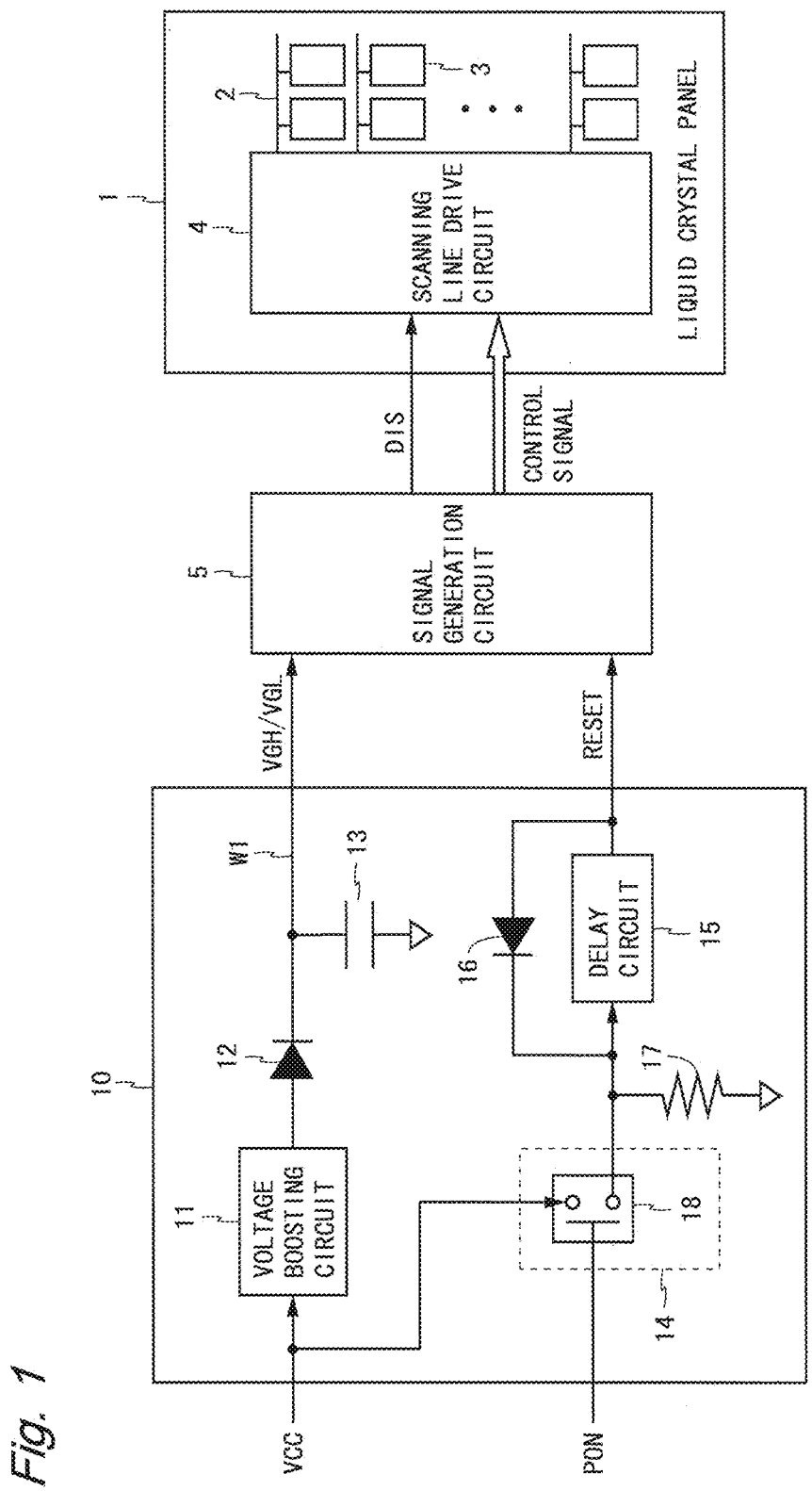
FIG. 1 is a block diagram showing a configuration of a power supply circuit according to an embodiment.

FIG. 1 is a block diagram showing a configuration of a power supply circuit according to an embodiment. A power supply circuit 10 shown in FIG. 1 includes a voltage boosting circuit 11, diodes 12, 16, a capacitor 13, a logic circuit 14, a delay circuit 15, and a resistor 17.

The power supply circuit 10 is provided to a liquid crystal display device including a liquid crystal panel 1. The liquid crystal panel 1 is an IGZO liquid crystal panel including thin film transistors formed using IGZO. Scanning lines 2, data lines (not shown), and pixels 3 are formed in a pixel area of the liquid crystal panel 1. A scanning line drive circuit 4 is formed inside or in a surrounding portion of the pixel area. A liquid crystal panel obtained by placing the scanning line drive circuit 4 in the pixel area is called a liquid crystal panel having an IPGDM (In Pixel Gate Driver Monolithic) configuration. A signal generation circuit 5 is provided outside the liquid crystal panel 1.

A power supply voltage VCC and a control signal PON are externally supplied to the power supply circuit 10. The power supply voltage VCC is a voltage of a low-voltage system including voltages of 3.3 V and a ground level (GND), for example. The voltage boosting circuit 11 is a DC/DC converter or the like, and boosts the power supply voltage VCC to power supply voltages VGH/VGL used in the scanning line drive circuit 4. The power supply voltages VGH/VGL are voltages of a high-voltage system including voltages of +21 V and −7 V, for example. The power supply voltages VGH/VGL are supplied to the signal generation circuit 5 via the diode 12. The logic circuit 14 outputs a high-level signal when the power supply voltage VCC and the control signal PON are at a high level. An output signal of the logic circuit 14 is input to the delay circuit 15. The delay circuit 15 outputs, as a control signal RESET, a signal obtained by delaying the output signal of the logic circuit 14 by a predetermined time (hereinafter referred to as Td). The control signal RESET is supplied to the signal generation circuit 5, and is used for an operation control of the scanning line drive circuit 4.

The signal generation circuit 5 generates control signals for the scanning line drive circuit 4 based on the power supply voltages VGH/VGL and the control signal RESET. The control signals generated by the signal generation circuit 5 include a start pulse, a clock signal, a discharge signal DIS, and the like. The control signal RESET indicates an operation start and an operation stop of the signal generation circuit 5. When the control signal RESET indicates the operation stop, the signal generation circuit 5 outputs the discharge signal DIS having a discharge pulse to the scanning line drive circuit 4.

A power supply wiring W1 connecting the voltage boosting circuit 11 and the signal generation circuit 5 is a power supply wiring for outputting the power supply voltages VGH/VGL. The diode 12 is provided on the power supply wiring W1. An anode terminal of the diode 12 is connected to an output terminal of the voltage boosting circuit 11, and a cathode terminal of the diode 12 is connected to an output terminal of the power supply circuit 10. When a power supply turns off, the diode 12 makes an output voltage of the power supply circuit 10 change later than an output voltage of the voltage boosting circuit 11. The capacitor 13 is provided between the power supply wiring W1 and a ground. A capacitor having a large capacitance is used as the capacitor 13. The capacitor 13 holds the power supply voltages VGH/VGL.

The logic circuit 14 includes a switch 18. The power supply voltage VCC is supplied to one terminal (upper-side terminal in FIG. 1) of the switch 18. Another terminal of the switch 18 is connected to an input terminal of the delay circuit 15. The control signal PON is supplied to a control terminal of the switch 18. The switch 18 turns on when the control signal PON is at the high level, and turns off otherwise. When the control signal PON is at the high level, the power supply voltage VCC is input to the delay circuit 15 via the switch 18. In this manner, the logic circuit 14 outputs the high-level signal when the power supply voltage VCC and the control signal PON are at the high level.

The delay circuit 15 outputs, as the control signal RESET, the signal obtained by delaying the output signal of the logic circuit 14 by the time Td. The diode 16 is connected to both ends of the delay circuit 15. More specifically, an anode terminal of the diode 16 is connected to an output terminal of the delay circuit 15, and a cathode terminal of the diode 16 is connected to the input terminal of the delay circuit 15. The diode 16 allows current to flow from the output terminal of the delay circuit 15 to the input terminal of the delay circuit 15, the current not flowing via the delay circuit 15. The resistor 17 is provided between the input terminal of the delay circuit 15 and the ground. The resistor 17 makes a voltage of the input terminal of the delay circuit 15 fall in a short time, when a voltage of the control signal PON falls.

Figure 2:
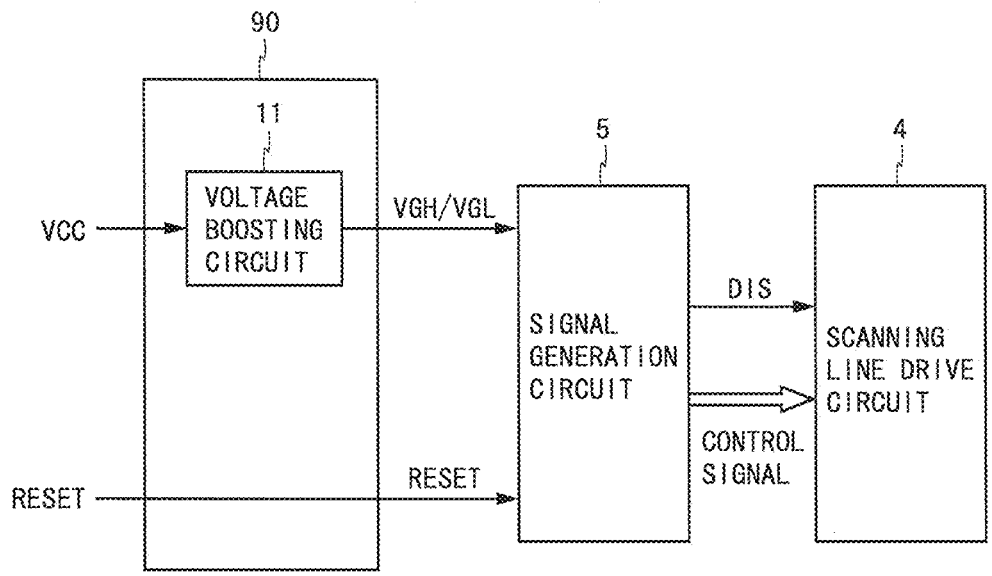
FIG. 2 is a block diagram showing a configuration of a conventional power supply circuit.

By removing the diodes 12, 16, the capacitor 13, the logic circuit 14, the delay circuit 15, and the resistor 17 from the power supply circuit 10 and supplying the control signal RESET which is supplied externally, to the signal generation circuit 5 as it is, a power supply circuit 90 shown in FIG. 2 is obtained. Conventional and general power supply circuits have a configuration shown in FIG. 2. The power supply circuit 10 according to the present embodiment is obtained by adding the diodes 12, 16, the capacitor 13, the logic circuit 14, the delay circuit 15, and the resistor 17 to the conventional power supply circuit 90.

Figure 3:
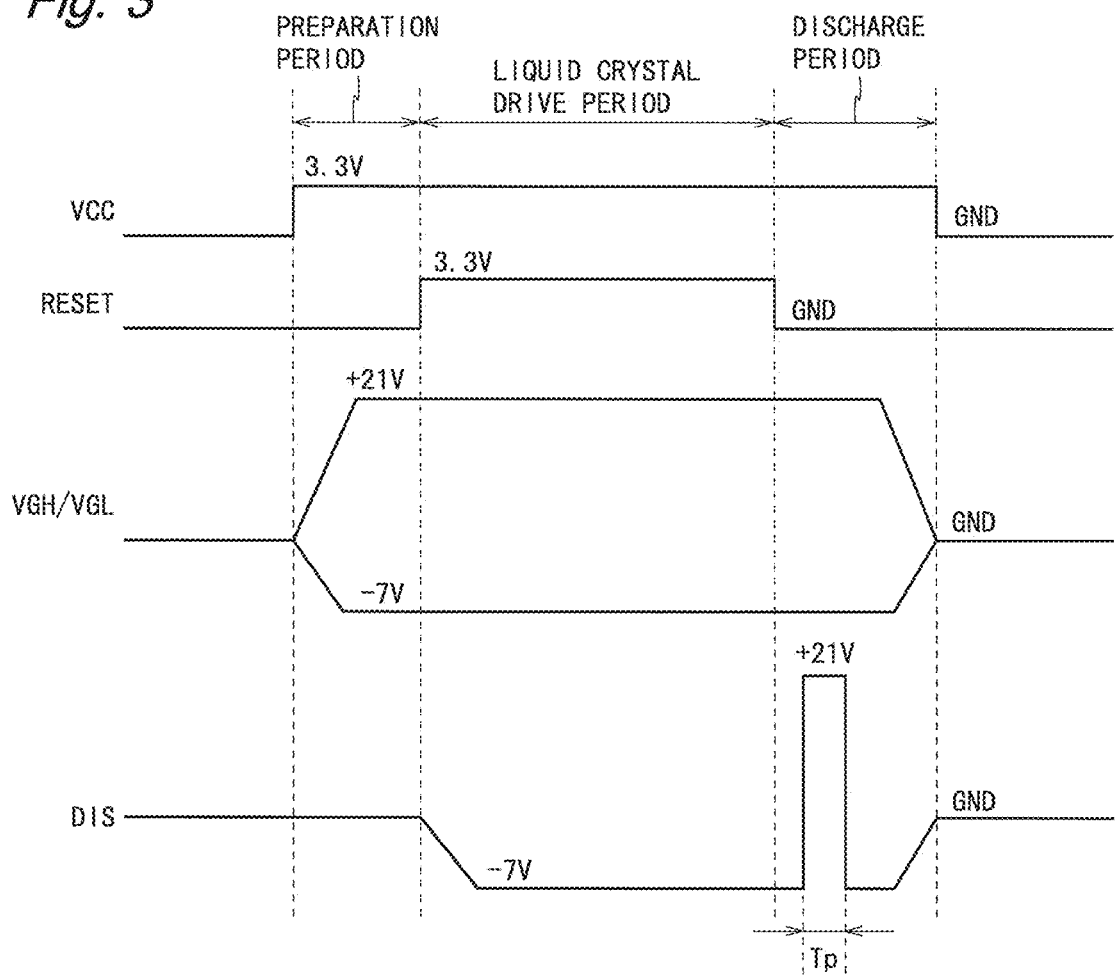
FIG. 3 is a signal waveform diagram showing a power supply sequence of the power supply circuits.

FIG. 3 is a signal waveform diagram showing a power supply sequence of the power supply circuits 10, 90. FIG. 3 describes the power supply sequence which should be obeyed by the power supply voltage VCC and the control signal RESET. When the power supply turns on, the power supply voltage VCC first rises to the high level (for example, 3.3 V). After this, the voltage boosting circuit 11 boosts the power supply voltage VCC to the power supply voltages VGH/VGL. After the power supply voltages VGH/VGL reach predetermined levels (for example, +21 V and −7 V), the control signal RESET rises to the high level. A period from rising of the power supply voltage VCC to rising of the control signal RESET is a preparation period for generating the power supply voltages VGH/VGL. After the control signal RESET rises, the signal generation circuit 5 outputs the control signals to the scanning line drive circuit 4 based on the power supply voltages VGH/VGL. After the power supply turns on, a voltage of the discharge signal DIS becomes the power supply voltage VGL (here, −7 V).

When the power supply turns off, the control signal RESET first falls to a low level (ground level). When detecting falling of the control signal RESET, the signal generation circuit 5 stops outputting of the control signals other than the discharge signal DIS and outputs the discharge signal DIS having the discharge pulse. At this time, the voltage of the discharge signal DIS becomes the power supply voltage VGH (here, +21 V) for the predetermined time Tp. The discharge pulse is used to draw out charge from the pixels 3 included in the liquid crystal panel 1 and the scanning line drive circuit 4. After a discharge is performed, the voltage boosting circuit 11 stops the operation and the power supply voltages VGH/VGL change to the ground level. After that, the power supply voltage VCC falls to the ground level.

In the power supply sequence shown in FIG. 3, in order to perform the discharge correctly when the power supply turns off, it is necessary to make the control signal RESET fall in a short time and hold the power supply voltages VGH/VGL until the discharge is completed after the control signal RESET falls.

However, in an on-vehicle liquid crystal display device, it may be impossible to stably supply a voltage to the power supply circuit due to an operation of an engine, a rapid change of load, or the like. Thus, the power supply sequence shown in FIG. 3 cannot be obeyed when the power supply turns off, and there may be a case where the power supply voltage VCC falls earlier than the control signal RESET and a case where both signals fall almost simultaneously.

Figure 4:
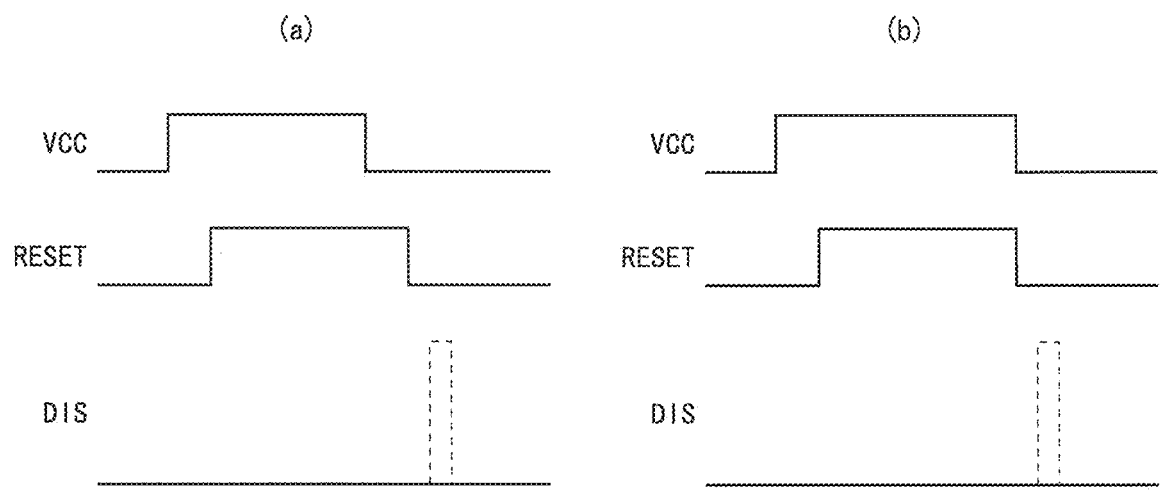
FIG. 4 is a signal waveform diagram of the conventional power supply circuit.

FIG. 4 is a signal waveform diagram of the conventional power supply circuit 90. In FIG. 4, a broken line indicates that there exists no discharge pulses. In the conventional power supply circuit 90, in a case (FIG. 4(*a*)) where the power supply voltage VCC falls earlier than the control signal RESET, and in a case where both signals fall almost simultaneously (FIG. 4(*b*)), the power supply voltage VCC is already low and the power supply voltages VGH/VGL are also already low when the discharge is to be performed. Thus, the discharge signal DIS having the discharge pulse cannot be output and the discharge cannot be performed correctly.

Furthermore, when the power supply turns on, the preparation period for generating the power supply voltages VGH/VGL is necessary. However, the power supply sequence shown in FIG. 3 cannot be obeyed when the power supply turns on, and there may be a case where the control signal RESET rises earlier than the power supply voltage VCC, and a case where both signals rise almost simultaneously. In the conventional power supply circuit 90, the control signals cannot be correctly output to the scanning line drive circuit 4 in such cases. Thus, in the on-vehicle liquid crystal display device having the conventional power supply circuit 90, a display abnormality may occur, or a liquid crystal panel may be destroyed in a worst case.

In order to solve these problems, the power supply circuit 10 according to the present embodiment includes the diodes 12, 16, the capacitor 13, the logic circuit 14, the delay circuit 15, and the resistor 17. According to the power supply circuit 10, the power supply sequence shown in FIG. 3 can be obeyed and the discharge can be certainly performed when the power supply turns off, as described below.

Figure 5:
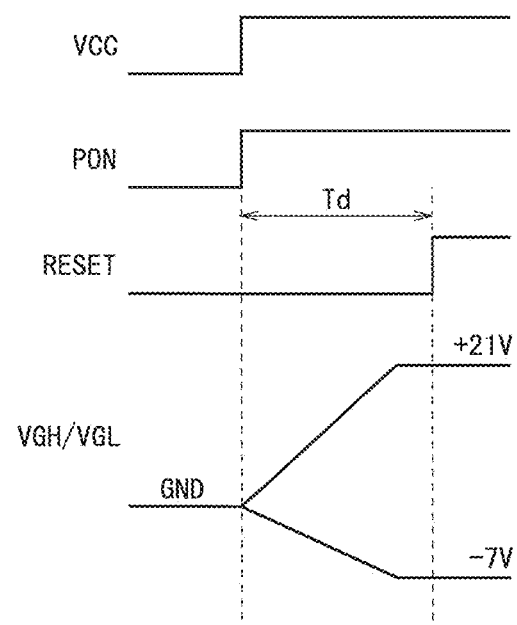

FIG. 5 is a signal waveform diagram of the power supply circuit 10 when the power supply turns on. The switch 18 turns on when the power supply voltage VCC and the control signal PON are at the high level. Thus, when the power supply turns on, the control signal RESET becomes the high level only after the power supply voltage VCC becomes the high level. Furthermore, the control signal RESET is a signal obtained by delaying the control signal PON by the time Td. Thus, even when the power supply voltage VCC and the control signal PON rise almost simultaneously, it takes time longer than the time Td from rising of the control signal PON to rising of the control signal RESET. If the time Td is set longer than some extent, the power supply voltages VGH/VGL reach the predetermined levels within the time Td. In this case, the control signal RESET rises to the high level only after the power supply voltages VGH/VGL reach the predetermined levels. Therefore, according to the power supply circuit 10, the power supply sequence shown in FIG. 3 can be obeyed when the power supply turns on.

Figure 6:
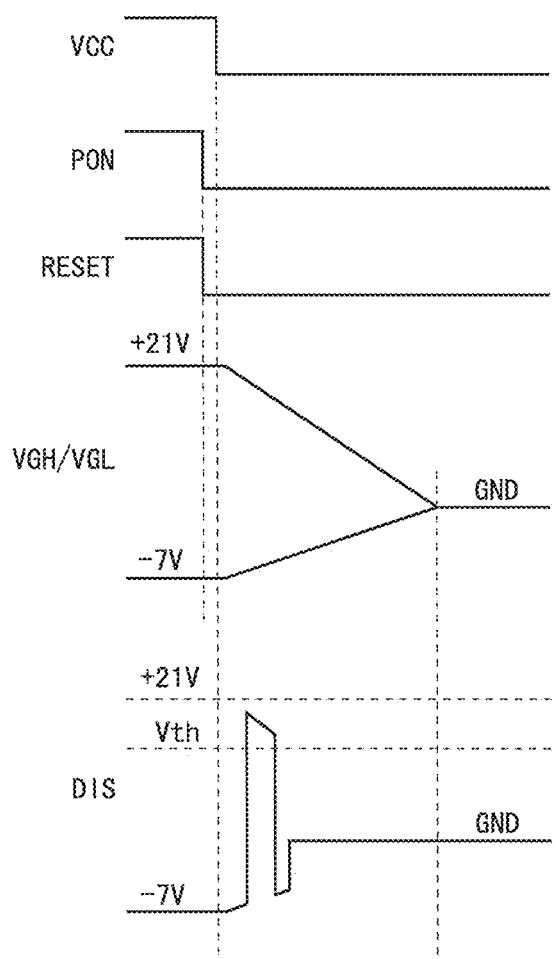
FIG. 6 is a signal waveform diagram of the power supply circuit shown in FIG. 1 when the power supply turns off.

FIG. 6 is a signal waveform diagram of the power supply circuit 10 when the power supply turns off. As described above, the diode 16 allows current to flow from the output terminal of the delay circuit 15 to the input terminal of the delay circuit 15, the current not flowing via the delay circuit 15. When the voltage of the control signal PON falls, the resistor 17 makes the voltage of the input terminal of the delay circuit 15 fall in a short time. Thus, when the control signal PON falls to the low level, the control signal RESET falls to the low level in a short time. Furthermore, the diode 12 and the capacitor 13 are provided on the power supply wiring W1 for outputting the power supply voltages VGH/VGL. Thus, after the power supply voltage VCC falls, the output voltage of the power supply circuit 10 changes later than the output voltage of the voltage boosting circuit 11, and the power supply voltage VGH output from the power supply circuit 10 is held at a level for a while, the level making thin film transistors included in the pixels 3 and the scanning line drive circuit 4 turn on (level higher than a threshold voltage Vth of the thin film transistor). Since the signal generation circuit 5 outputs the discharge signal DIS having the discharge pulse in the meantime, the discharge can be performed.

In a case where the power supply voltage VCC falls to the ground level before the control signal PON falls to the ground level, the output signal of the logic circuit 14 falls to the low level when the power supply voltage VCC falls. At this time, the control signal RESET falls to the low level in a short time. Also in this case, since the signal generation circuit 5 outputs the discharge signal DIS having the discharge pulse while the power supply voltage VGH is held at the high level, the discharge can be performed. Therefore, according to the power supply circuit 10, the power supply sequence shown in FIG. 3 can be obeyed also when the power supply turns off.

Figure 7:
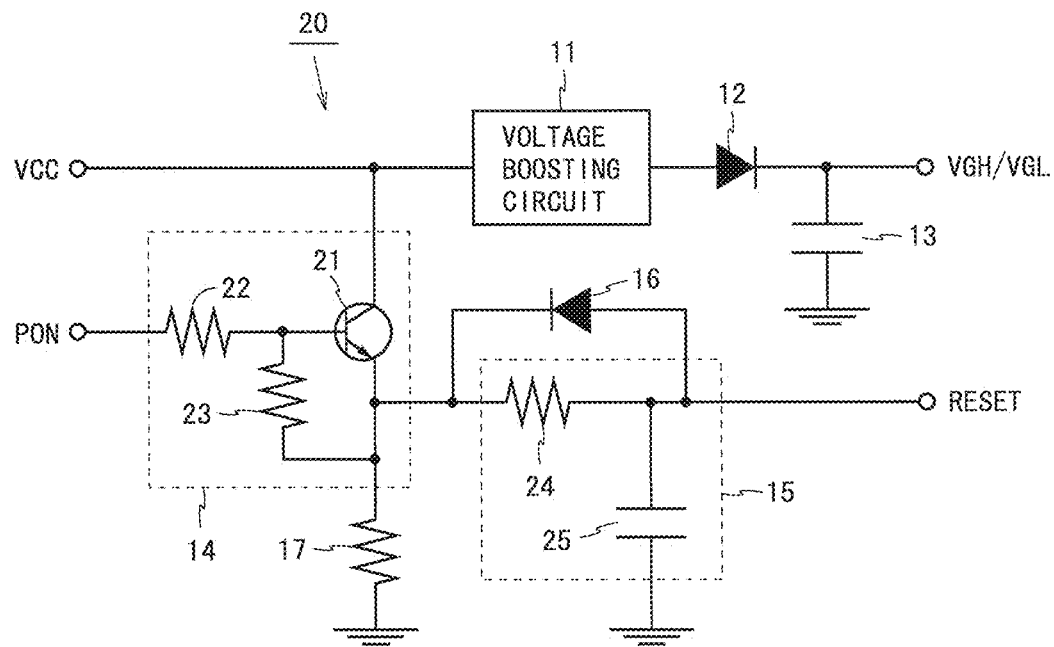
FIG. 7 is a diagram showing a specific example of the power supply circuit shown in FIG. 1.
Figure 8:
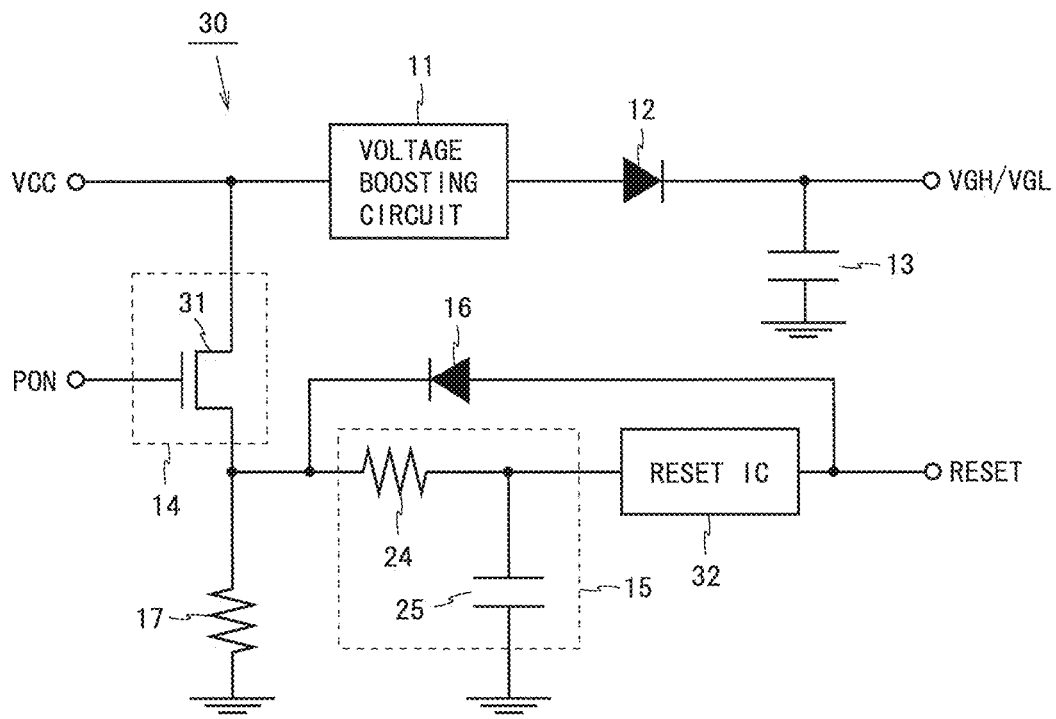
FIG. 8 is a diagram showing a specific example of the power supply circuit shown in FIG. 1.

FIGS. 7 and 8 are circuit diagrams each showing a specific example of the power supply circuit 10. In a power supply circuit 20 shown in FIG. 7, the logic circuit 14 consists of an NPN-type transistor 21 and resistors 22, 23. The power supply voltage VCC is supplied to a collector terminal of the transistor 21. An emitter terminal of the transistor 21 is connected to the input terminal of the delay circuit 15. The control signal PON is supplied to a base terminal of the transistor 21 via the resistor 22. The resistor 23 is provided between the base terminal and the collector terminal of the transistor 21. The transistor 21 functions as the switch 18. The delay circuit 15 includes a resistor 24 and a capacitor 25. The resistor 24 is provided on a signal wiring for connecting the input terminal and the output terminal of the delay circuit 15. The capacitor 25 is provided between the signal wiring and the ground. The delay time Td of the delay circuit 15 is determined by a product of a resistance value of the resistor 24 and a capacitance of the capacitor 25.

In a power supply circuit 30 shown in FIG. 8, the logic circuit 14 consists of an N-channel type MOSFET 31. The power supply voltage VCC is supplied to a drain terminal of the MOSFET 31. A source terminal of the MOSFET 31 is connected to the input terminal of the delay circuit 15. The control signal PON is supplied to a gate terminal of the MOSFET 31. The MOSFET 31 functions as the switch 18. The power supply circuit 30 includes a reset IC 32 in a later stage of the delay circuit 15. If the delay circuit 15 is configured by the resistor 24 and the capacitor 25, variation occurs easily in the delay time Td of the delay circuit 15. By providing the reset IC 32, the delay time between the control signal PON and the control signal RESET can be controlled correctly, even when the variation occurs in the delay time Td.

As for the power supply circuit 10 according to the present embodiment, various kinds of modifications can be configured. For example, the logic circuit 14 may be configured by an analog switch which turns on and off according to an electric signal. Furthermore, the power supply circuit may not include the diode 12 in a later stage of the voltage boosting circuit 11, and a diode included in the voltage boosting circuit 11 may function as the diode 12. Furthermore, the delay circuit 15 may be configured using a reset IC having a function of delaying an input signal to output a delayed signal. Furthermore, if the reset IC 32 has a function of making an output voltage fall immediately when an input voltage falls, the power supply circuit 30 shown in FIG. 8 may not include the diode 16.

Furthermore, a power supply circuit according to a modification may include one of logic circuits 41 to 44 shown in FIG. 9(a) to (d) in place of the logic circuit 14. As with the logic circuit 14, each of the logic circuits 41 to 44 outputs the high-level signal when the power supply voltage VCC and the control signal PON are at the high level.

Figure 9:
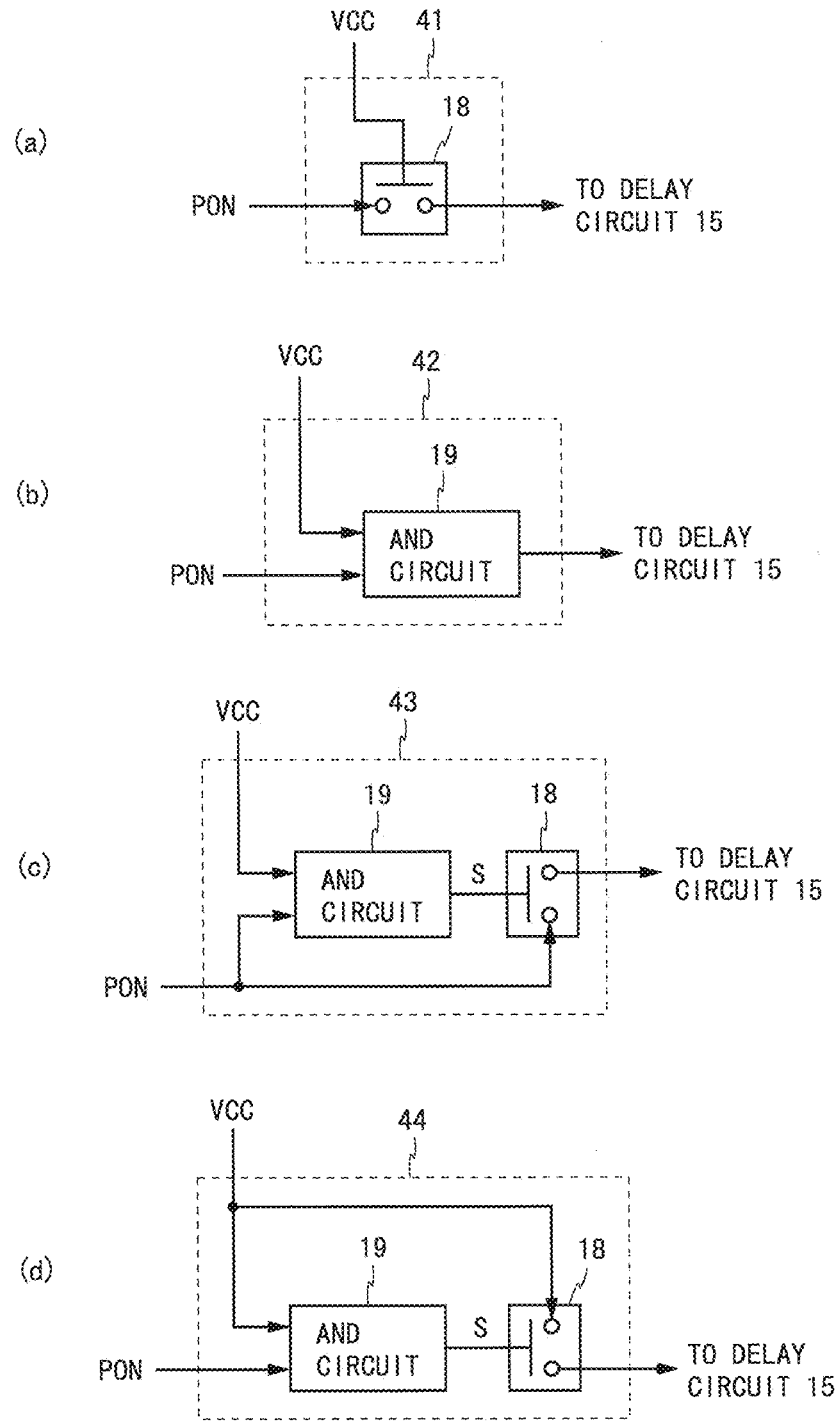
FIG. 9 is a diagram showing configurations of logic circuits of power supply circuits according to modifications.
Figure 10:
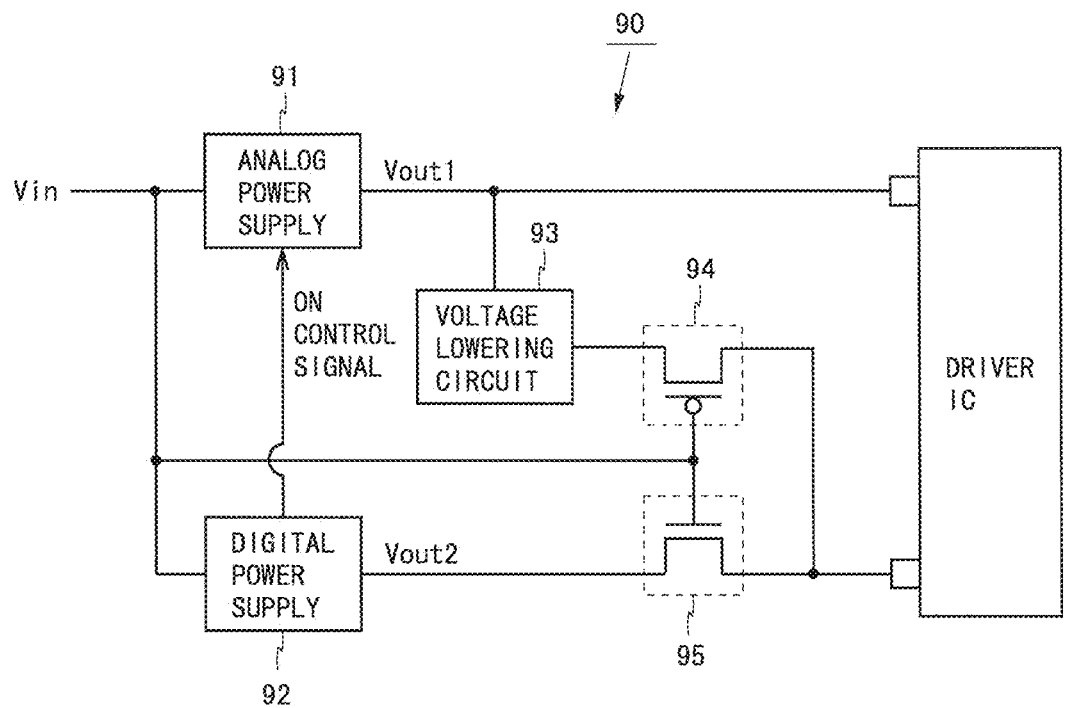
FIG. 10 is a block diagram showing a configuration of a conventional power supply circuit.

The logic circuit 41 shown in FIG. 9(a) includes the switch 18. The control signal PON is supplied to one terminal (left-side terminal in FIG. 9(a)) of the switch 18, and the power supply voltage VCC is supplied to the control terminal of the switch 18. Corresponding to this, in the power supply circuit 20 shown in FIG. 7, the control signal PON may be supplied to the collector terminal of the transistor 21, and the power supply voltage VCC may be supplied to the gate terminal of the transistor 21. In the power supply circuit 30 shown in FIG. 8, the control signal PON may be supplied to the drain terminal of the MOSFET 31, and the power supply voltage VCC may be supplied to the gate terminal of the MOSFET 31.

The logic circuit 42 shown in FIG. 9(b) includes an AND circuit 19. The power supply voltage VCC is input to one input terminal of the AND circuit 19, and the control signal PON is input to another input terminal of the AND circuit 19. An output terminal of the AND circuit 19 is connected to the input terminal of the delay circuit 15. The AND circuit 19 obtains a logical product of the power supply voltage VCC and the control signal PON to supply the logical product to the input terminal of the delay circuit 15.

The logic circuit 43 shown in FIG. 9(c) includes the switch 18 and the AND circuit 19. The AND circuit 19 obtains a logical product S of the power supply voltage VCC and the control signal PON. The control signal PON is supplied to one terminal (lower-side terminal in FIG. 9(c)) of the switch 18. Another terminal of the switch 18 is connected to the input terminal of the delay circuit 15. The logical product S is supplied to the control terminal of the switch 18. The switch 18 turns on when the logical product S is at the high level, and turns off otherwise. When the logical product S is at the high level, the control signal PON is input to the delay circuit 15 via the switch 18.

The logic circuit 44 shown in FIG. 9(d) includes the switch 18 and the AND circuit 19. The AND circuit 19 obtains the logical product S of the power supply voltage VCC and the control signal PON. The power supply voltage VCC is supplied to one terminal (upper-side terminal in FIG. 9(d)) of the switch 18. Another terminal of the switch 18 is connected to the input terminal of the delay circuit 15. The logical product S is supplied to the control terminal of the switch 18. The switch 18 turns on when the logical product S is at the high level, and turns off otherwise. When the logical product S is at the high level, the power supply voltage VCC is input to the delay circuit 15 via the switch 18.

Furthermore, the power supply circuit of the liquid crystal display device has been described so far, the power supply circuit may be provided to display devices other than the liquid crystal display device. Furthermore, by arbitrarily combining features of the above-described power supply circuits unless contrary to the nature, a power supply circuit according to a modification can be configured.

As described above, the power supply circuit according to the present embodiment and its modifications includes the voltage boosting circuit 11 for boosting a supplied first power supply voltage VCC to second power supply voltages VGH/VGL used in a drive circuit (scanning line drive circuit 4) of a display device (liquid crystal display device), the capacitor 13 provided between the power supply wiring W1 for outputting the second power supply voltage and the ground, a logic circuit for outputting the high-level signal when the first power supply voltage and a supplied first control signal (control signal PON) are at the high level, the delay circuit 15 for outputting the signal obtained by delaying the output signal of the logic circuit as a second control signal (control signal RESET) used for an operation control of the drive circuit, and the resistor 17 provided between and the input terminal of the delay circuit 15 and the ground.

According to such a power supply circuit, when a level of the first control signal falls when the power supply turns off, the voltage of the input terminal of the delay circuit falls in a short time by an action of the resistor, and the second control signal becomes the ground level in a short time. Furthermore, since the second power supply voltage is held by an action of the capacitor for a while after the first power supply voltage falls when the power supply turns off, the discharge pulse can be generated and the discharge can be performed in the meantime. Furthermore, the second control signal rises to the high level after the second power supply voltage reaches a predetermined level. Therefore, the control signal can be generated correctly when the power supply turns on, and the discharge can be performed certainly when the power supply turns off.

The power supply circuit may include a first diode (diode 12) on the power supply wiring W1. With this, when the power supply turns off, the output voltage of the power supply circuit can be made to change later than the output voltage of the voltage boosting circuit 11. Furthermore, the power supply circuit may include a second diode (diode 16) having an anode terminal connected to the output terminal of the second control signal and a cathode terminal connected to the input terminal of the delay circuit 15. With this, when a level of the first control signal falls when the power supply turns off, current flows through the second diode, the voltage of the input terminal of the delay circuit 15 falls in a short time, and the second control signal becomes the ground level in a short time. Furthermore, the power supply circuit 30 may include the reset IC 32 in a later stage of the delay circuit 15. With this, even when variation occurs in the delay time Td of the delay circuit 15, the delay time between the first control signal and the second control signal can be controlled correctly.

Each of the logic circuits 14, 41 may include the switch 18 having one terminal to which one of the first power supply voltage and the first control signal is supplied, another terminal connected to the input terminal of the delay circuit 15, and a control terminal to which another of the first power supply voltage and the first control signal is supplied. The switch 18 may be a bipolar transistor (transistor 21) having one conduction terminal (emitter terminal) to which the first power supply voltage is supplied, another conduction terminal (collector terminal) connected to the input terminal of the delay circuit 15, and a control terminal (gate terminal) to which the first control signal is supplied (FIG. 7). The switch 18 may be a MOS transistor (MOSFET 31) having one conduction terminal (drain terminal) to which the first power supply voltage is supplied, another conduction terminal (source terminal) connected to the input terminal of the delay circuit 15, and a control terminal (gate terminal) to which the first control signal is supplied (FIG. 8). The logic circuit 42 may include the AND circuit 19 for obtaining the logical product of the first power supply voltage and the first control signal. Each of the logic circuits 43, 44 may include the AND circuit 19 for obtaining the logical product of the first control signal and the first power supply voltage, and the switch 18 having one terminal to which one of the first control signal and the first power supply voltage is supplied, another terminal connected to the input terminal of the delay circuit 15, and a control terminal to which the logical product is supplied. The delay circuit 15 may include the resistor 24 provided on a signal wiring for connecting an input terminal and an output terminal, and the capacitor 25 provided between the signal wiring and the ground. The delay circuit 15 may include a reset IC for delaying an input signal to output a delayed signal.

The display device (liquid crystal display device) according to the present embodiment includes a display panel (liquid crystal panel 1) including the scanning lines 2 and the pixels 3, the scanning line drive circuit 4 for driving the scanning lines 2, the above-described power supply circuit, and the signal generation circuit 5 for outputting the discharge signal DIS having the discharge pulse based on the second power supply voltage, when the second control signal indicates the operation stop. The thin film transistor included in the liquid crystal panel 1 may be formed using an oxide semiconductor, and the oxide semiconductor may be indium gallium zinc oxide. With respect to these display devices, the discharge can be certainly performed when the power supply turns off, and a display failure can be prevented.

Although the present invention is described in detail in the above, the above description is exemplary in all of the aspects and is not restrictive. It is understood that various other changes and modification can be derived without going out of the present invention.

What is claimed is:

1. A power supply circuit comprising:
a voltage boosting circuit configured to boost a supplied first power supply voltage to a second power supply voltage used in a drive circuit of a display device;
a capacitor provided between a power supply wiring for outputting the second power supply voltage and a ground;
a logic circuit configured to output a high-level signal when the first power supply voltage and a supplied first control signal are at a high level;
a delay circuit configured to output a signal obtained by delaying an output signal of the logic circuit as a second control signal used for an operation control of the drive circuit; and
a resistor provided between an input terminal of the delay circuit and the ground.

2. The power supply circuit according to claim 1, further comprising a first diode on the power supply wiring.

3. The power supply circuit according to claim 1, further comprising a second diode having an anode terminal connected to an output terminal of the second control signal and a cathode terminal connected to the input terminal of the delay circuit.

4. The power supply circuit according to claim 1, further comprising a reset IC in a later stage of the delay circuit.

5. The power supply circuit according to claim 1, wherein the logic circuit includes a switch having one terminal to which one of the first power supply voltage and the first control signal is supplied, another terminal connected to the input terminal of the delay circuit, and a control terminal to which another of the first power supply voltage and the first control signal is supplied.

6. The power supply circuit according to claim 5, wherein the switch is a bipolar transistor having one conduction terminal to which one of the first power supply voltage and the first control signal is supplied, another conduction terminal connected to the input terminal of the delay circuit, and a control terminal to which another of the first power supply voltage and the first control signal is supplied.

7. The power supply circuit according to claim 5, wherein the switch is a MOS transistor having one conduction terminal to which one of the first power supply voltage and the first control signal is supplied, another conduction terminal connected to the input terminal of the delay circuit, and a control terminal to which another of the first power supply voltage and the first control signal is supplied.

8. The power supply circuit according to claim 1, wherein the logic circuit includes an AND circuit configured to obtain a logical product of the first power supply voltage and the first control signal to supply the logical product to the input terminal of the delay circuit.

9. The power supply circuit according to claim 1, wherein the logic circuit includes:
an AND circuit configured to obtain a logical product of the first power supply voltage and the first control signal; and
a switch having one terminal to which one of the first power supply voltage and the first control signal is supplied, another terminal connected to the input terminal of the delay circuit, and a control terminal to which the logical product is supplied.

10. The power supply circuit according to claim 1, wherein the delay circuit includes:
a resistor provided on a signal wiring for connecting an input terminal and an output terminal; and
a capacitor provided between the signal wiring and the ground.

11. The power supply circuit according to claim 1, wherein the delay circuit includes a reset IC configured to delay an input signal to output a delayed signal.

12. A display device comprising:
a display panel including scanning lines and pixels;
a scanning line drive circuit configured to drive the scanning lines;
the power supply circuit according to claim 1; and
a signal generation circuit configured to output a discharge signal having a discharge pulse to the scanning line drive circuit based on the second power supply voltage, when the second control signal indicates an operation stop.

13. The display device according to claim 12, wherein the display panel is a liquid crystal panel.

14. The display device according to claim 13, wherein a thin film transistor included in the liquid crystal panel is formed using an oxide semiconductor.

15. The display device according to claim 14, wherein the oxide semiconductor is indium gallium zinc oxide.

* * * * *